(12) United States Patent
Farkas et al.

(10) Patent No.: US 11,582,864 B2
(45) Date of Patent: Feb. 14, 2023

(54) IMPEDANCE MATCHING WITHIN A SIGNAL TRANSMISSION CHANNEL

(71) Applicant: DELL PRODUCTS, LP, Round Rock, TX (US)

(72) Inventors: Sandor Farkas, Round Rock, TX (US); Bhyrav Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 43 days.

(21) Appl. No.: 17/197,878

(22) Filed: Mar. 10, 2021

(65) Prior Publication Data

US 2022/0295628 A1    Sep. 15, 2022

(51) Int. Cl.
*H05K 1/02* (2006.01)

(52) U.S. Cl.
CPC ... *H05K 1/025* (2013.01); *H05K 2201/09281* (2013.01); *H05K 2201/09727* (2013.01)

(58) Field of Classification Search
CPC ..... H05K 1/025; H05K 1/0251; H05K 1/0253
See application file for complete search history.

(56) References Cited

U.S. PATENT DOCUMENTS

| | | | |
|---|---|---|---|
| 8,643,168 B1 * | 2/2014 | Wong | H03K 19/17716 257/700 |
| 2005/0130501 A1 | 6/2005 | Timmins et al. | |
| 2020/0006836 A1 * | 1/2020 | Hu | G02B 6/4279 |
| 2020/0352025 A1 | 11/2020 | Vasa et al. | |

* cited by examiner

*Primary Examiner* — Jeremy C Norris
(74) *Attorney, Agent, or Firm* — Larson Newman, LLP (57) ABSTRACT

A printed circuit board for an information handling system includes a trace, a routing component, and one or more intermediate components. The trace has a first impedance, and the routing component has a second impedance. The intermediate components have respective intermediate impedances. Each of the intermediate impedances has a corresponding value in a range between a value of the first impedance and a value of the second impedance. The one or more intermediate impedances reduce an impedance discontinuity between the trace and the routing component.

18 Claims, 5 Drawing Sheets

IMPEDANCE MATCHING WITHIN A SIGNAL TRANSMISSION CHANNEL

FIELD OF THE DISCLOSURE

The present disclosure generally relates to information handling systems, and more particularly relates to impedance matching within a signal transmission channel.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A printed circuit board for an information handling system includes a trace or other signal transmission channel, a routing component, and one or more intermediate components. The trace has a first impedance, and the routing component has a second impedance. The intermediate components have respective intermediate impedances. Each of the intermediate impedances has a corresponding value in a range between a value of the first impedance and a value of the second impedance. The intermediate impedances may reduce an impedance discontinuity between the trace and the routing component.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
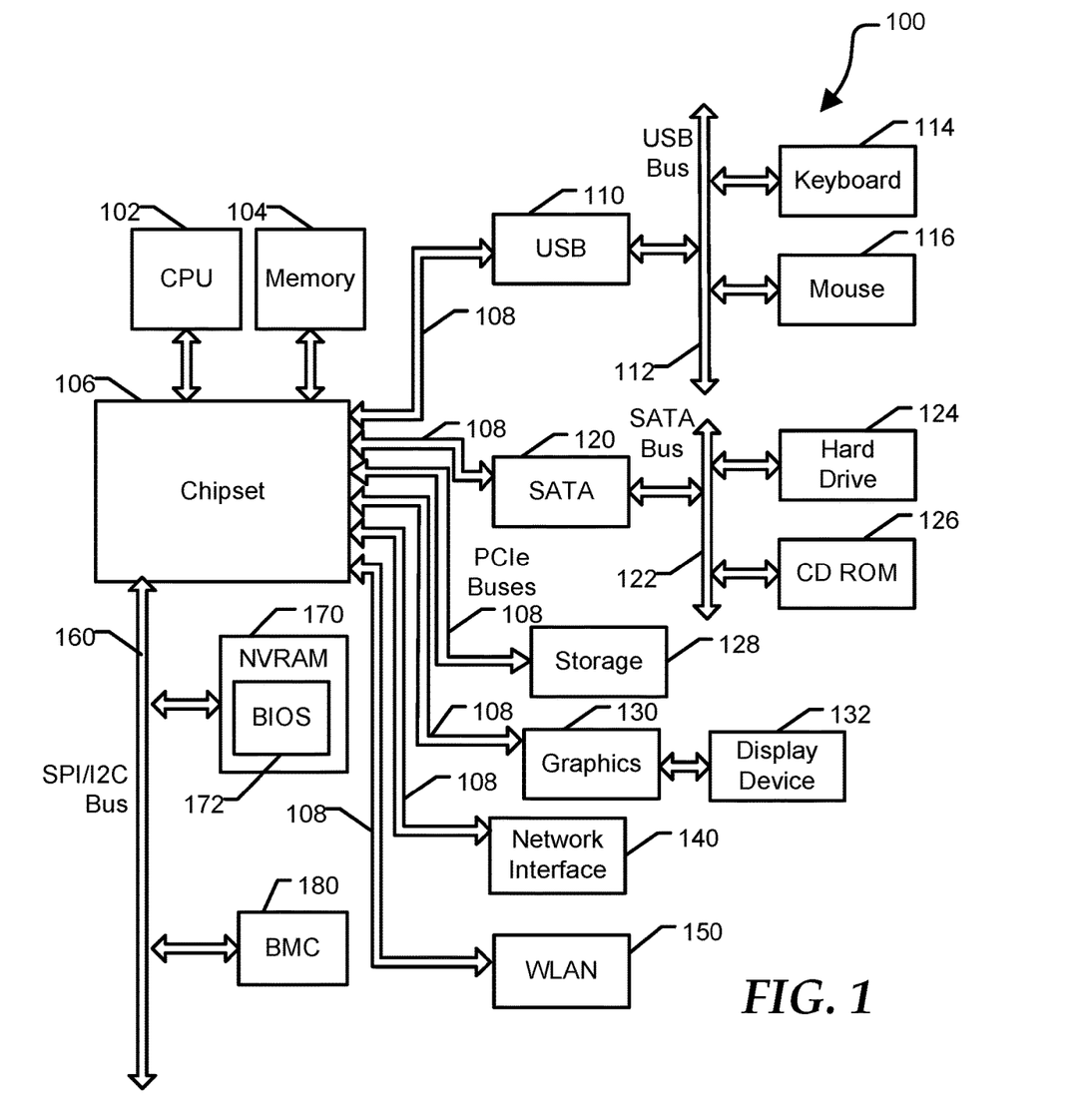
FIG. 1 is a block diagram of a general information handling system according to at least one embodiment of the present disclosure.

FIG. 1 illustrates a general information handling system 100. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various other I/O devices, such as a keyboard, a mouse, and a video display. The information handling system may also include one or more busses operable to transmit communications between the various hardware components.

Information handling system 100 including a processor 102, a memory 104, a chipset 106, one or more PCIe buses 108, a universal serial bus (USB) controller 110, a USB bus 112, a keyboard device controller 114, a mouse device controller 116, a configuration a SATA bus controller 120, a SATA bus 122, a hard drive device controller 124, a compact disk read only memory (CD ROM) device controller 126, a storage 128, a graphics device controller 130, a network interface controller (NIC) 140, a wireless local area network (WLAN) or wireless wide area network (WWAN) controller 150, a serial peripheral interface (SPI) bus 160, a NVRAM 170 for storing BIOS 172, and a baseboard management controller (BMC) 180. In an example, chipset 106 may be directly connected to an individual end point via a PCIe root port within the chipset and a point-to-point topology as shown in FIG. 1. BMC 180 can be referred to as a service processor or embedded controller (EC). Capabilities and functions provided by BMC 180 can vary considerably based on the type of information handling system. For example, the term baseboard management system is often used to describe an embedded processor included at a server, while an embedded controller is more likely to be found in a consumer-level device. As disclosed herein, BMC 180 represents a processing device different from CPU 102, which provides various management functions for information handling system 100. For example, an embedded controller may be responsible for power management, cooling management, and the like. An embedded controller included at a data storage system can be referred to as a storage enclosure processor.

System 100 can include additional processors that are configured to provide localized or specific control functions, such as a battery management controller. Bus 160 can include one or more busses, including a SPI bus, an I2C bus, a system management bus (SMBUS), a power management bus (PMBUS), and the like. BMC 180 can be configured to provide out-of-band access to devices at information handling system 100. As used herein, out-of-band access herein refers to operations performed prior to execution of BIOS 172 by processor 102 to initialize operation of system 100.

BIOS 172 can be referred to as a firmware image, and the term BIOS is herein used interchangeably with the term firmware image, or simply firmware. BIOS 172 includes instructions executable by CPU 102 to initialize and test the hardware components of system 100, and to load a boot loader or an operating system (OS) from a mass storage device. BIOS 172 additionally provides an abstraction layer for the hardware, such as a consistent way for application programs and operating systems to interact with the keyboard, display, and other input/output devices. When power is first applied to information handling system 100, the system begins a sequence of initialization procedures. During the initialization sequence, also referred to as a boot sequence, components of system 100 are configured and enabled for operation, and device drivers can be installed. Device drivers provide an interface through which other components of the system 100 can communicate with a corresponding device.

Information handling system 100 can include additional components and additional busses, not shown for clarity. For example, system 100 can include multiple processor cores, audio devices, and the like. While a particular arrangement of bus technologies and interconnections is illustrated for the purpose of example, one of skill will appreciate that the techniques disclosed herein are applicable to other system architectures. System 100 can include multiple CPUs and redundant bus controllers. One or more components can be integrated together. For example, portions of chipset 106 can be integrated within CPU 102. Additional components of information handling system 100 can include one or more storage devices that can store machine-executable code, one or more communications ports for communicating with external devices, and various input and output (I/O) devices, such as a keyboard, a mouse, and a video display. An example of information handling system 100 includes a multi-tenant chassis system where groups of tenants (users) share a common chassis, and each of the tenants has a unique set of resources assigned to them. The resources can include blade servers of the chassis, input/output (I/O) modules, Peripheral Component Interconnect-Express (PCIe) cards, storage controllers, and the like.

Figure 2:
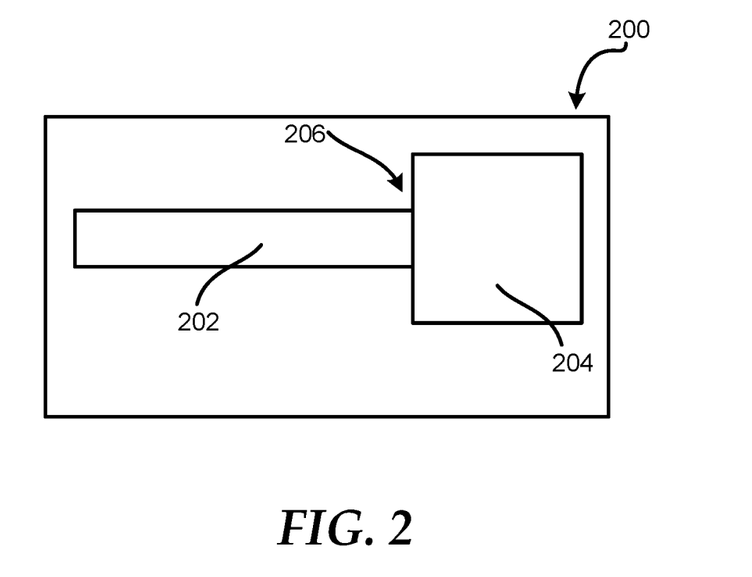
FIG. 2 is a diagram of a trace and a routing component of a printed circuit board in an information handling system according to at least one embodiment of the disclosure.
Figure 3:
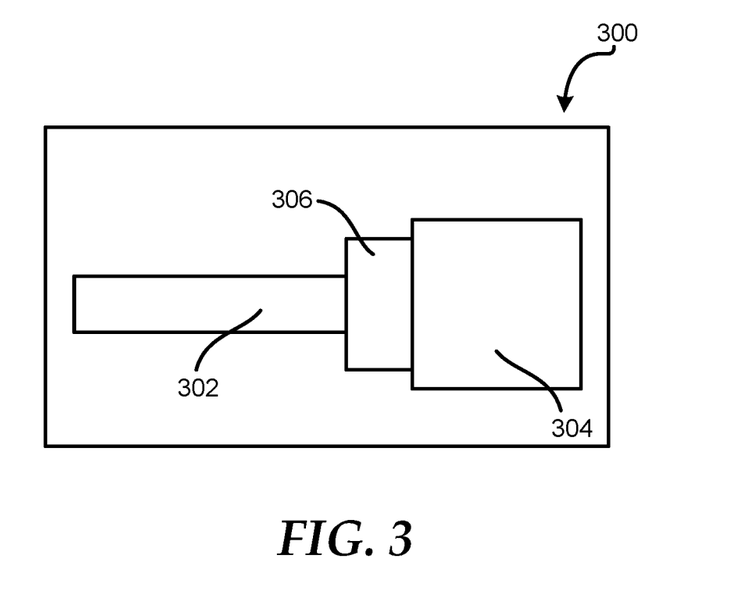
FIG. 3 is a diagram of a trace, an intermediate component, and a routing component of a printed circuit board assembly according to at least one embodiment of the disclosure.
Figure 4:
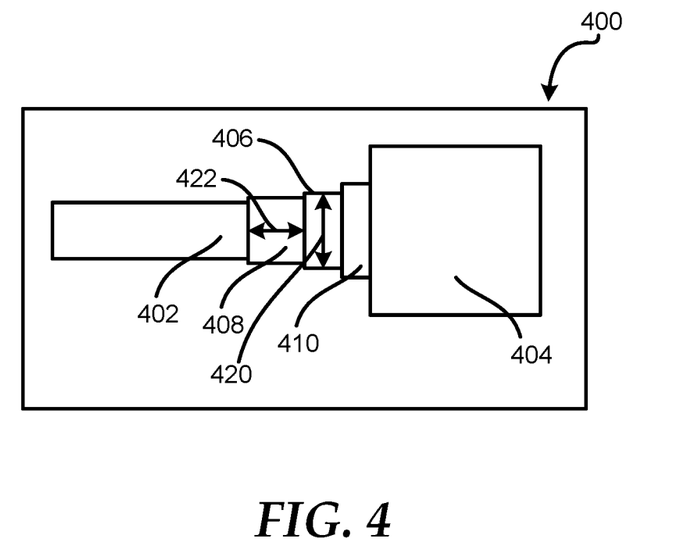
FIG. 4 is a diagram of a trace, multiple intermediate components, and a routing component of a printed circuit board according to at least one embodiment of the present disclosure.
Figure 5:
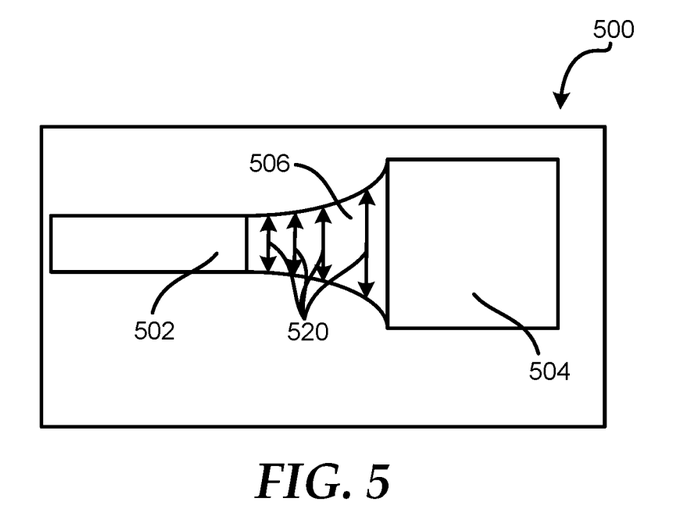
FIG. 5 is a diagram of a trace, a tapered intermediate component, and a routing component of a printed circuit board according to at least one embodiment of the present disclosure.
Figure 6:
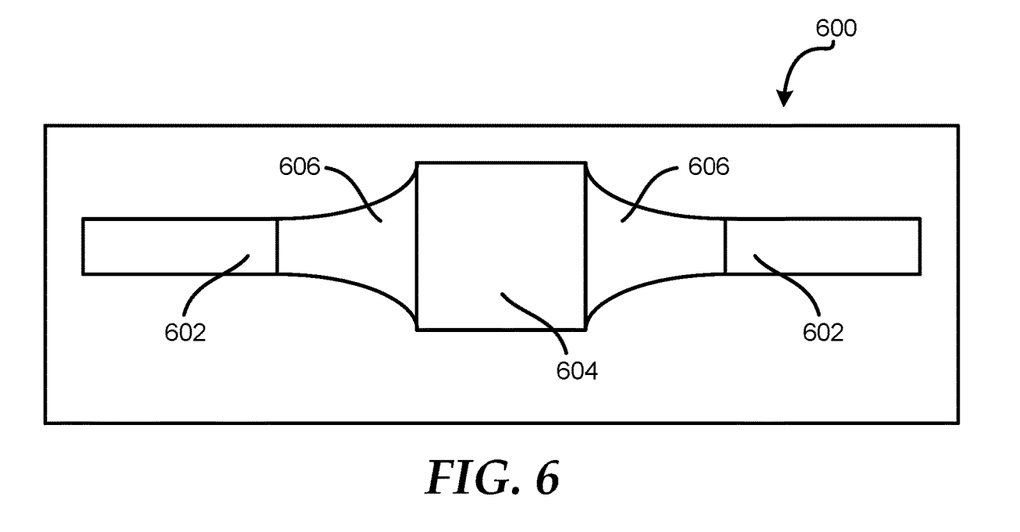
FIG. 6 is a diagram of a trace, multiple tapered intermediate components, and a routing component of a printed circuit board according to at least one embodiment of the present disclosure.

In an example, information handling system 100 may include any suitable device including, but not limited to, printed circuit board 200 of FIG. 2, printed circuit board 300 of FIG. 3, printed circuit board 400 of FIG. 4, printed circuit board 500 of FIG. 5, and printed circuit board 600 of FIG. 6. Information handling system 100 can include a set of instructions that can be executed to cause the information handling system to perform any one or more of the methods or computer based functions disclosed herein. The information handling system 100 may operate as a standalone device or may be connected to other computer systems or peripheral devices, such as by a network.

In a networked deployment, the information handling system 100 may operate in the capacity of a server or as a client user computer in a server-client user network environment, or as a peer computer system in a peer-to-peer (or distributed) network environment. The information handling system 100 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 100 can be implemented using electronic devices that provide voice, video or data communication. Further, while a single information handling system 100 is illustrated, the term "system" shall also be taken to include any collection of systems or sub-systems that individually or jointly execute a set, or multiple sets, of instructions to perform one or more computer functions.

FIG. 2 illustrates a printed circuit board (PCB) 200 for an information handling system, such as information handling system 100 of FIG. 1, according to at least one embodiment of the disclosure. The PCB 200 includes a trace 202 and a routing component 204. For clarity and brevity signal transmission is disclosed with respect a trace, a routing component, and other components on a PCB. However, the signal transmission may be within any suitable communication channel, such as a cable, a trace, or the like, without varying from the scope of this disclosure. Similarly, the signal transmission may be any suitable routing component, such as a via, a connector, a pad, or the like, without varying from the scope of this disclosure. In an example, communication channels may have higher signal integrity to ensure proper signal transmissions of signals with higher frequencies. In this example, discontinuity between impedances of the communication channel and the routing component may result in reflections of the signal.

In certain examples, trace 202 may have a different impedance as compared to routing component 204. For example, even if routing component 204 is rated or specified to be a particular impedance, most of the time the actual impedance does not match the impedance of trace 202. In certain examples, if routing component 204 is a via, the routing component may act as an impedance drop due to capacitance of the routing component. In high density PCBs 200, thin traces 202 may result in impedances that are higher than the impedance of routing component 204.

In an example, an impedance discontinuity 206 may occur at the junction of trace 202 and routing component 204. In this example, the impedance discontinuity or mismatch 206 may cause a reflection of the signal, which in turn may result in a ripple in an insertion loss of the transmission channel of trace 202 and routing component 204. In certain examples, a resulting ripple in the insertion loss of the transmission channel may increase or get worse as signals are transmitted at higher speeds. Transmission speeds along trace 202 and routing component 204 may currently be within any suitable range including, but not limited to, eight gigabits/second to thirty-two gigabits/second. In future PCBs 200, the transmission rates may increase to one hundred and twelve gigabits/second or more. In an example, PCB 200 of an information handling system, such as information handling system 100 of FIG. 1, may be improved based on one or more intermediate components being routed on the PCB in between trace 202 and routing component 204 as will be described with respect to FIGS. 3-8 below.

FIG. 3 illustrates a PCB 300 including a trace 302, a routing component 304, and an intermediate component 306 according to at least one embodiment of the disclosure. In an example, trace 302 may have a particular impedance and routing component 304 may have a different impedance that is lower than the impedance of the trace. For example, the impedance discontinuity between trace 302 and routing component 304 may be any suitable impedance difference including, but not limited to, one hundred ohms to seventy ohms, and one hundred ohms to fifty ohms. If intermediate component 306 is not routed between trace 302 and routing component 304, the junction or physical communication between the trace and routing component may cause an impedance discontinuity, such as impedance discontinuity 206 shown in FIG. 2. In an example, this discontinuity may result in an abrupt impedance change between trace 302 and routing component 304. In an example, if the abrupt change in impedance between trace 302 and routing component 304 occurs within a fraction of a wavelength of the transmitted signal, the impedance discontinuity may cause reflections to occur.

In an example, intermediate component 306 may have an intermediate impedance that is at a value in between the impedance of trace 302 and routing component 304. A length of intermediate component 306 may cause an impedance change from trace 302 to routing component 304 to transition over a few wavelengths of the transmitted signal. Based on the transition between trace 302 and routing component 304 being over a few wavelengths, the amount and intensity of the reflections may be minimized.

In certain examples, the intermediate impedance for intermediate component 306 may be determined or calculated in any suitable manner. For example, the intermediate impedance may be calculated as a geometric mean of impedance of the trace and the impedance of the routing component. In certain examples, any intermediate impedance may be selected, but determining an intermediate impedance substantially equal to the geometric mean may be best for optimum performance. In an example, the intermediate impedance ($Z_{eff}$) for intermediate component 306 may be calculated based on the impedance ($Z_{01}$) of trace 302 and on the impedance ($Z_{02}$) of routing component 304. This calculation may be made using equation 1 below:

$$Z_{eff} = \sqrt{(Z_{01} * Z_{02})} \quad \text{EQ. 1}$$

Based on equation 1 above, the intermediate impedance ($Z_{eff}$) for intermediate component 306 is equal to the square root of the product of impedance ($Z_{01}$) of trace 302 and impedance ($Z_{02}$) of routing component 304. Based on the calculated intermediate impedance ($Z_{eff}$), the width of intermediate component 306 may be determined. In an example, the lower the calculated intermediate impedance ($Z_{eff}$), the larger the width of intermediate component 306. Thus, the width of intermediate component 306 may be adjusted or determined based on the calculated intermediate impedance ($Z_{eff}$). In response to the width of intermediate component 306 being determined, the intermediate component may be routed in between trace 302 and routing component 304, and may have the determined width. In an example, intermediate impedance of intermediate component 306 may reduce the ripple in the insertion loss of the transmission channel as compared to discontinuity 206 of FIG. 2.

FIG. 4 illustrates a PCB 400 including a trace 402, a routing component 404, and multiple intermediate components 406, 408, and 410 according to at least one embodiment of the present disclosure. In an example, trace 402 may have a particular impedance and routing component 404 may have a different impedance that is lower than the impedance of the trace. In certain examples, the larger size of routing component 404, the lower the impedance of the routing component.

In an example, each of intermediate components 406, 408, and 410 may have different intermediate impedances in a range between the impedance of trace 402 and routing component 404. In certain examples, several variables in intermediate components 406, 408, and 410 may be utilized to change the respective impedances including, but not limited to, width, thickness, and conductive material. Intermediate components 406, 408, and 410 may have varying widths 420 to transition between trace 402 and routing component 404. A length 422 of each of intermediate components 406, 408, and 410 may cause an impedance change from trace 402 to routing component 404 to transition over a few wavelengths of the transmitted signal. For example, length 422 of each of intermediate components 406, 408, and 410 may be inversely proportional to the respective widths of the intermediate components. Based on the transition between trace 402 and routing component 404 being over a few wavelengths, the amount and intensity of the reflections may be minimized. In an example, length 422 of each of intermediate components 406, 408, and 410 may be controlled, and the length may be changed based on the routing density on PCB 400.

In certain examples, the intermediate impedances for respective intermediate components 406, 408, and 410 may be determined or calculated in any suitable manner. For example, the intermediate impedances may be calculated as a geometric mean of the impedances of the adjacent components. In an example, the intermediate impedance ($Z_{eff}$) for intermediate component 406, 408, or 410 may be calculated based on the impedance ($Z_{01}$) of one adjacent component and on the impedance ($Z_{02}$) of another adjacent component as illustrated in equation 1 above.

Based on equation 1 above, the intermediate impedance ($Z_{eff}$) for intermediate component 406 may be equal to the square root of the product of impedance ($Z_{01}$) of trace 402 and impedance ($Z_{02}$) of routing component 404. Based on the calculated intermediate impedance ($Z_{eff}$), width 420 of intermediate component 406 may be determined. The intermediate impedance ($Z_{eff}$) for intermediate component 408 may be equal to the square root of the product of impedance ($Z_{01}$) of trace 402 and impedance ($Z_{02}$) of intermediate component 406. Based on the calculated intermediate impedance ($Z_{eff}$), width 420 of intermediate component 408 may be determined. Similarly, the intermediate impedance ($Z_{eff}$) for intermediate component 410 may be equal to the square root of the product of impedance ($Z_{01}$) of routing component 404 and impedance ($Z_{02}$) of intermediate component 406. Based on the calculated intermediate impedance ($Z_{eff}$), width 420 of intermediate component 410 may be determined.

In an example, the lower the respective calculated intermediate impedance ($Z_{eff}$), the larger the width of intermediate components 406, 408, and 410. Thus, widths 420 of intermediate components 406, 408, and 410 may be vary based on the calculated intermediate impedances ($Z_{eff}$). In response to the width of intermediate components 406, 408, and 410 being determined, the intermediate components may be routed in between trace 402 and routing component 404, and may have the determined respective widths. In an example, intermediate impedances of intermediate components 406, 408, and 410 may further reduce the ripple in the insertion loss of the transmission channel as compared to intermediate component 306 of FIG. 3. In certain examples, as the number of intermediate impedances increases, the ripple in the insertion loss of the transmission channel may corresponding decrease. For example, as the intermediate impedances of discrete intermediate components 406, 408, and 410 get closer together in value, a single tapered intermediate component 506, as shown in FIG. 5, may be utilized instead of the discrete intermediate components.

FIG. 5 illustrates a PCB 500 including a trace 502, a routing component 504, and a tapered intermediate component 506 according to at least one embodiment of the present disclosure. In an example, trace 502 may have a particular impedance and routing component 504 may have a different impedance that is lower than the impedance of the trace. In certain examples, the larger size of routing component 404, the lower the impedance of the routing component.

Tapered intermediate component 506 may have multiple varying widths 520 as the tapered intermediate component extends from trace 502 to routing component 504. In an example, a length of tapered intermediate component 506 may be any suitable length greater than a wavelength of the transmitted signal. Based on the transition between trace 402 and routing component 404 being over a wavelength, the amount and intensity of the reflections may be minimized.

In certain examples, the intermediate impedances for respective intermediate components 406, 408, and 410 may be determined or calculated in any suitable manner. For example, the intermediate impedances may be calculated as a geometric mean of the impedances of adjacent components. Based on equation 1 above, multiple intermediate impedances ($Z_{eff}$) may be calculated tapered intermediate component 506. For example, each intermediate impedance ($Z_{eff}$) may be equal to the square root of the product of impedance ($Z_{oi}$) of trace 402 and impedance ($Z_{02}$) of an adjacent portion of tapered intermediate component 506. Based on the calculated intermediate impedances ($Z_{eff}$), multiple widths 520 of tapered intermediate component 506 may be determined. In certain examples, any suitable number of intermediate impedances may be calculated or determined for tapered intermediate component 506. As the number of intermediate impedances increases, the ripple in the insertion loss of the transmission channel may decrease. Thus, tapered intermediate component 506 may decrease the ripple in the insertion loss of the transmission channel as compared to discrete intermediate components 406, 408, and 410 of FIG. 4. In response to the intermediate impedances being calculated, tapered intermediate components 506 may be routing in between trace 602 and routing component 504 as shown in FIG. 5.

FIG. 6 illustrates a PCB 600 including a trace 602, a routing component 604, multiple tapered intermediate components 606 according to at least one embodiment of the present disclosure. In an example, trace 602 may run or pass through routing component 604, which may cause impedance discontinuities on both sides of routing component 604. In this example, tapered intermediate components 606 or any other suitable intermediate components may be routing in physical communication with and in between trace 602 and respective sides of routing component 604. Routing component 606 may be any suitable lower impedance component including, but not limited to, a via, and a wider trace.

In an example, any suitable number of impedances variations for tapered intermediate components 606 may be calculated. For example, the varying impedance for tapered intermediate components 606 may be calculated in substantially the same manner as described above with respect to tapered intermediate component 506 of FIG. 5. In response to the varying impedances being calculated, tapered intermediate components 606 may be routing in between trace 602 and both sides of routing component 604 as shown in FIG. 6.

Figure 7:
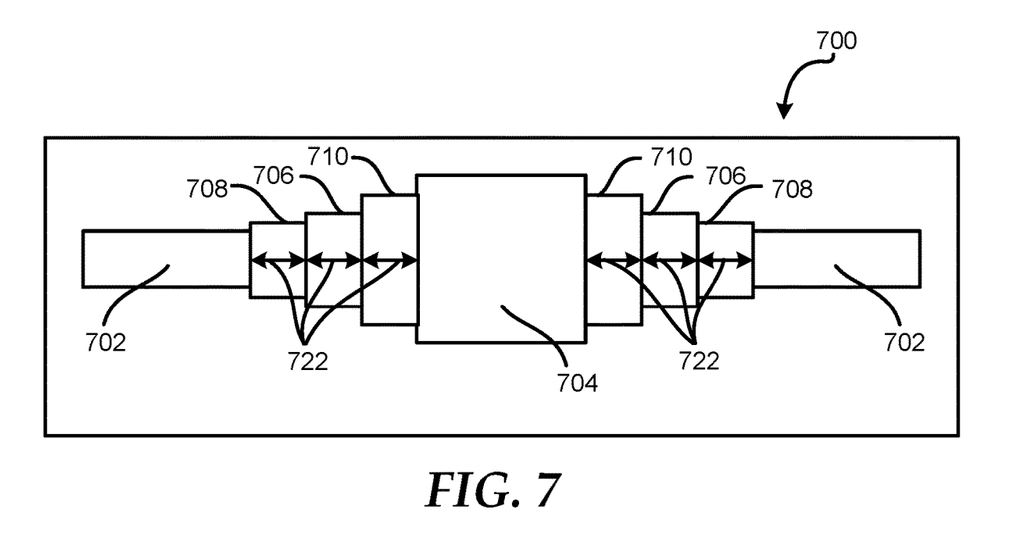
FIG. 7 is a diagram of a trace, multiple intermediate components, and a routing component of a printed circuit board according to at least one embodiment of the present disclosure.

FIG. 7 illustrates a PCB 700 including a trace 702, a routing component 704, and intermediate components 706, 708, and 710 according to at least one embodiment of the present disclosure. In an example, trace 702 may have a particular impedance and routing component 704 may have a different impedance that is lower than the impedance of the trace. In certain examples, the larger size of routing component 704, the lower the impedance of the routing component.

In an example, each of intermediate components 706, 708, and 710 may have different intermediate impedances in a range between the impedance of trace 702 and routing component 704. In certain examples, a length 722 of each of intermediate components 706, 708, and 710 may be constant for each of the intermediate components. In an example, lengths 722 of intermediate components 706, 708, and 710 may be any suitable length greater than a wavelength of the transmitted signal. Based on the transition between trace 702 and routing component 704 being over a wavelength, the amount and intensity of the reflections may be minimized.

In certain examples, the intermediate impedances for respective intermediate components 706, 708, and 710 may be determined or calculated in any suitable manner. For example, the intermediate impedances may be calculated in substantially the same manner as described above with respect to intermediate component 406, 408, and 410 of FIG. 4. In response to the intermediate impedances being calculated, intermediate components 706, 708, and 710 may be routing in between trace 702 and both sides of routing component 704 as shown in FIG. 7.

While the one or more intermediate components have been disclosed herein to transition in low impedance discontinuities, such as going from a higher impedance to a lower impedance, the one or more intermediate components may also be utilized in high impedance discontinuities, such as going from a lower impedance to a higher impedance. In this situation, the one or more intermediate components may taper or step down in size so that their respective impedances may taper or step down from one component to the next.

Figure 8:
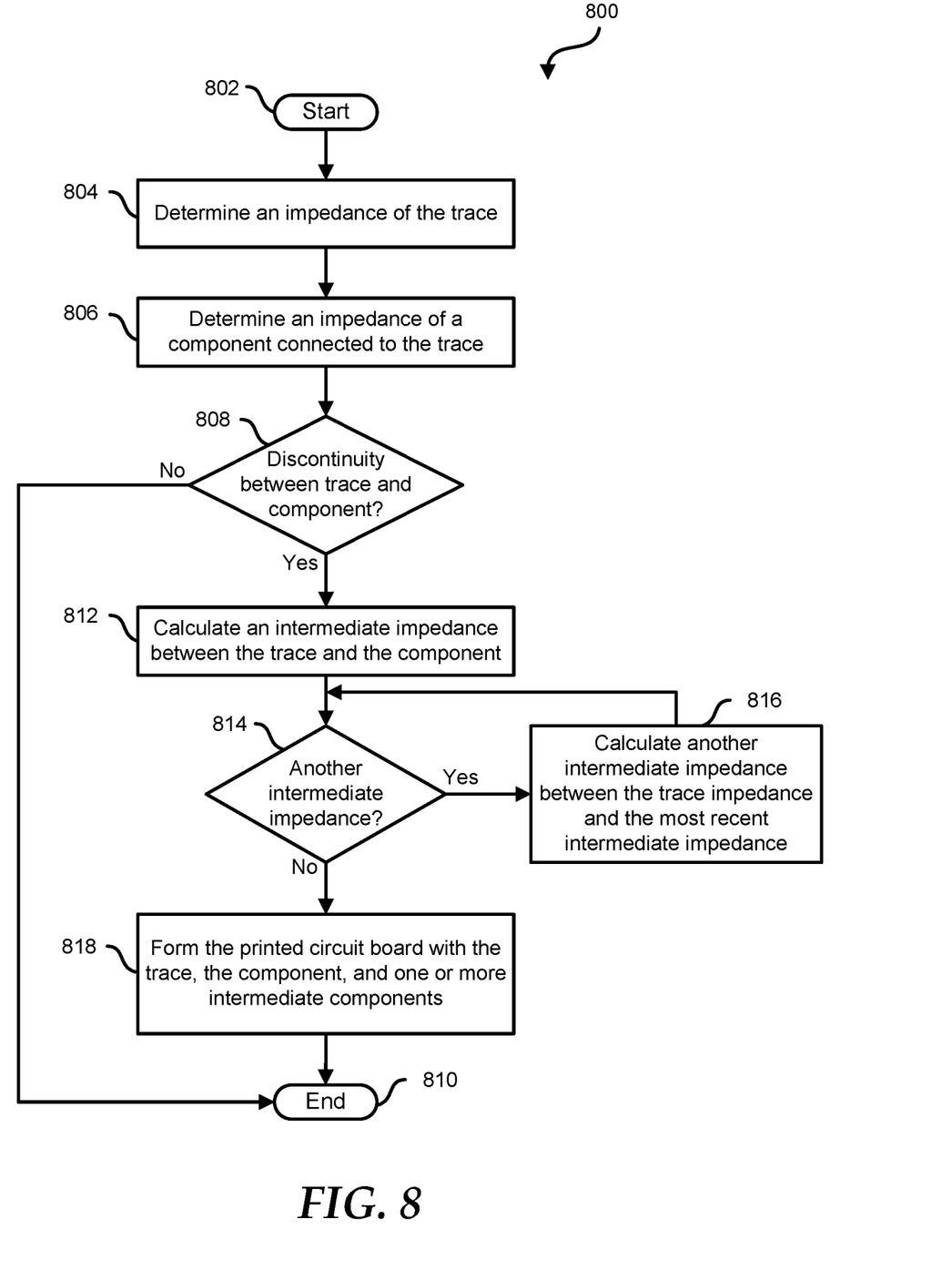
FIG. 8 is a flow diagram of a method for forming a printed circuit board having a trace, an intermediate component, and a routing component according to at least one embodiment of the present disclosure.

FIG. 8 illustrates a flow diagram of a method 800 for forming a printed circuit board having a trace, an intermediate component, and a routing component according to at least one embodiment of the present disclosure, starting at block 802. It will be readily appreciated that not every method step set forth in this flow diagram is always necessary, and that certain steps of the methods may be combined, performed simultaneously, in a different order, or perhaps omitted, without varying from the scope of the disclosure. FIG. 8 may be employed in whole, or in part, by information handling system 100 depicted in FIG. 1 or any other type of system, controller, device, module, processor, or any combination thereof, operable to employ all, or portions of, the method of FIG. 8.

At block 804, an impedance of a trace for a printed circuit board of an information handling system is determined. At block 806, an impedance of a routing component for the printed circuit board is determined. At block 808, a determination is made whether an impedance discontinuity exists between the trace and the routing component. In an example, the impedance discontinuity may be any large change in impedance values within a length less than a wavelength of a signal transmitted on the trace and the routing component. The large change may be from a higher impedance to a lower impedance, or from a lower impedance to a higher impedance. If an impedance discontinuity does not exist, the method ends at block 410.

If an impedance discontinuity does exist, an intermediate impedance for an intermediate component is determined at block 812. In an example, the intermediate impedance ($Z_{eff}$) for the intermediate component may be calculated based on the impedance ($Z_{01}$) of the trace and on the impedance ($Z_{02}$) of the routing component. At block 814, a determination is made whether another intermediate impedance for another intermediate component may be determined.

If another intermediate impedance is to be determined, a new intermediate impedance is calculated at block 816, and the flow continues as stated above at block 814. In an example, the new intermediate impedance ($Z_{eff}$) may be calculated based on the impedance ($Z_{01}$) of the trace and on the most recently calculated impedance ($Z_{02}$). If at block 814, another intermediate impedance is not to be determined, the PCB is formed with the trace, the routing component, and one or more intermediate components in between the trace and the routing component, and the method ends at block 810. In an example, the one or more intermediate components may be any suitable number of components including, but not limited to, a single block intermediate component, multiple discrete intermediate components, and a single tapered intermediate component. In certain examples, if the trace runs through the routing component, the method 800 may be performed for a junction of the trace with each side of the routing component.

Referring back to FIG. 1, the information handling system 100 can include a disk drive unit and may include a computer-readable medium, not shown in FIG. 1, in which one or more sets of instructions, such as software, can be embedded. Further, the instructions may embody one or more of the methods or logic as described herein. In a particular embodiment, the instructions may reside completely, or at least partially, within system memory 104 or another memory included at system 100, and/or within the processor 102 during execution by the information handling system 100. The system memory 104 and the processor 102 also may include computer-readable media.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a processor or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A printed circuit board for an information handling system, the printed circuit board comprising:
   a trace having a first impedance;
   a routing component having a second impedance; and
   one or more intermediate components having a respective intermediate impedance, each of the intermediate impedances have a corresponding value in a range between a value of the first impedance and a value of the second impedance, the intermediate impedances to reduce an impedance discontinuity between the trace and the routing component, wherein the one or more intermediate components include:
      a first intermediate component having a first intermediate impedance, the first intermediate component in physical communication with the routing component;
      a second intermediate component having a second intermediate impedance, the second intermediate component in physical communication with the first intermediate component; and
      a third intermediate component having a third intermediate impedance, the third intermediate component in physical communication with and located in between the trace and the second intermediate component.

2. The printed circuit board of claim 1, wherein the one or more intermediate components is a single tapered component having a varying impedance.

3. The printed circuit board of claim 2, wherein the varying impedance is highest near the trace and lowest near the routing component.

4. The printed circuit board of claim 2, wherein the single tapered component is thinnest near the trace, widens toward the routing component, and is thickest near the routing component.

5. The printed circuit board of claim 1, wherein the one or more intermediate impedances of the respective one or more intermediate components spread the impedance discontinuity between the trace and the routing component over a length equal to a number of wavelengths of a signal transmitted along the trace, the one or more intermediate components, and the routing component.

6. The printed circuit board of claim 1, wherein the first intermediate impedance is a lowest impedance of the one or more impedances, the third intermediate impedance is a highest impedance of the one or more impedances, and the second intermediate impedance is an impedance in between the first and third impedances.

7. The printed circuit board of claim 1, wherein the one or more intermediate impedances are formed based on respective lengths and widths of the respective one or more intermediate components.

8. A method comprising:
   determining a first impedance of a trace for a printed circuit board of an information handling system;
   determining a second impedance of a routing component for the printed circuit board;
   based on the first and second impedances, determining a first intermediate impedance for a first intermediate component;
   based on the first impedance and the first intermediate impedance, determining a second intermediate impedance for a second intermediate component;
   based on the first impedance and the second intermediate impedance, determining a third intermediate impedance for a third intermediate component; and
   routing the trace, the first, second, and third intermediate components, and the routing component on the printed circuit board.

9. The method of claim 8, wherein determining the first, second, and third intermediate impedances further comprises calculating a plurality of intermediate impedances for a single tapered intermediate component, wherein the plurality of intermediate impedances includes the first, second, and third intermediate impedances.

10. The method of claim 9, further comprising based on the intermediate impedances of the single tapered intermediate component, determining a plurality of different widths for the single tapered intermediate component.

11. The method of claim 10, further comprising routing the single tapered intermediate component between the first trace and the routing component with a smallest width of the single tapered intermediate component in physical communication with the trace and a largest width of the single tapered intermediate component in physical communication with the routing component.

12. The method of claim 8, further comprising:
   based on the first intermediate impedance, determining a first width and a first length of the first intermediate component;
   based on the second intermediate impedance, determining a second width and a second length of the second intermediate component; and
   based on the third intermediate impedance, determining a third width and a third length of the third intermediate component.

13. The method of claim 12, wherein the routing of the trace, the first, second, and third intermediate components, and the routing component on the printed circuit board of the information handling system further comprises:
   routing the first intermediate component in physical communication with the routing component;
   routing the second intermediate component in physical communication with the first intermediate component; and
   routing the third intermediate component in physical communication with and in between the second intermediate component and the trace.

14. A printed circuit board for an information handling system, the printed circuit board comprising:
   a trace having a first impedance;
   a routing component having a second impedance, the trace runs through the routing component; and
   a plurality of intermediate components, each of the intermediate components having an intermediate impedance with a corresponding value in a range between a value of the first impedance and a value of the second impedance, a first of the intermediate components to reduce a first impedance discontinuity between the trace and a first side of the routing component, and a second of the intermediate components to reduce a first impedance discontinuity between the trace and a first side of the routing component.

15. The printed circuit board of claim 14, wherein the first intermediate component is a first tapered component having a varying impedance.

16. The printed circuit board of claim 15, wherein the varying impedance is highest near the trace and lowest near the routing component.

17. The printed circuit board of claim 15, wherein the first tapered component is thinnest near the trace, widens toward the routing component, and is thickest near the routing component.

18. The printed circuit board of claim 14, wherein each of the intermediate impedances of the respective intermediate components spread the impedance discontinuity between the trace and the routing component over a length equal to a number of wavelengths of a signal transmitted along the trace, the one or more intermediate components, and the routing component.

* * * * *